US010178762B2

(12) United States Patent
Janssen et al.

(10) Patent No.: US 10,178,762 B2
(45) Date of Patent: Jan. 8, 2019

(54) DEVICE AND METHOD FOR TRANSMITTING DIFFERENTIAL DATA SIGNALS

(71) Applicant: LEONI KABEL HOLDING GMBH, Nuremberg (DE)

(72) Inventors: Bernd Janssen, Friesoythe ot Neuscharrel (DE); Christoph Untiedt, Klein Berssen (DE); Hergen Blessen, Uplengen (DE)

(73) Assignee: LEONI Kabel Holding GmbH, Nuremberg (DE)

( * ) Notice: Subject to any disclaimer, the term of this patent is extended or adjusted under 35 U.S.C. 154(b) by 52 days.

(21) Appl. No.: 15/295,207

(22) Filed: Oct. 17, 2016

(65) Prior Publication Data

US 2017/0099728 A1  Apr. 6, 2017

Related U.S. Application Data

(63) Continuation of application No. PCT/EP2015/058095, filed on Apr. 14, 2015.

(30) Foreign Application Priority Data

Apr. 16, 2014  (DE) .................. 10 2014 207 367

(51) Int. Cl.
*H05K 1/02* (2006.01)
*H03H 1/00* (2006.01)
(Continued)

(52) U.S. Cl.
CPC .......... *H05K 1/0245* (2013.01); *H01P 3/026* (2013.01); *H03H 1/0007* (2013.01); *H04B 3/28* (2013.01);
(Continued)

(58) Field of Classification Search
CPC .. H01P 3/026; H04B 3/28; H04B 3/30; H05K 1/0245; H05K 1/025; H05K 1/0234;
(Continued)

(56) References Cited

U.S. PATENT DOCUMENTS 7,297,028 B2  11/2007  Daikuhara et al.
8,444,430 B2   5/2013  Kappla et al.
(Continued)

FOREIGN PATENT DOCUMENTS

CN     101142861 A    3/2008
EP       2112669 A2   10/2009
(Continued)

OTHER PUBLICATIONS

Francesco De Paulis et al., "Miniaturization of Common mode filter based on EBG patch resonance", DesignCon 2012.
(Continued)

*Primary Examiner* — Rakesh Patel
*Assistant Examiner* — Jorge Salazar, Jr.
(74) *Attorney, Agent, or Firm* — Laurence A. Greenberg; Werner H. Stemer; Ralph E. Locher

(57) ABSTRACT

A device, in particular a pre-assembled transmission cable, is used to transmit differential data signals in a high-speed data connection. The device contains a circuit board with a conductor pair with two signal conductors for transmitting the differential data signal. An output line which is insulated from the conductor pair is paired with the conductor pair, the output line running parallel to the signal conductors in a non-interrupted manner and additionally being connected to a measuring conductor via at least one damping element. By virtue of the configuration, an undesired common-mode signal component is at least partly coupled into the output line, where the signal component is absorbed during operation.

17 Claims, 3 Drawing Sheets

(51) Int. Cl.
*H01P 3/02* (2006.01)
*H04B 3/28* (2006.01)
*H04B 3/30* (2006.01)
*H05K 1/11* (2006.01)

(52) U.S. Cl.
CPC ............... *H04B 3/30* (2013.01); *H05K 1/025* (2013.01); *H05K 1/0234* (2013.01); *H05K 1/0246* (2013.01); *H05K 1/0298* (2013.01); *H05K 1/117* (2013.01); *H05K 2201/09672* (2013.01); *H05K 2201/10015* (2013.01)

(58) Field of Classification Search
CPC .... H05K 1/0246; H05K 1/0298; H05K 1/117; H05K 2201/09672; H05K 2201/10015; H03H 1/0007
USPC ... 333/1, 4, 5, 204, 205, 236, 238, 245, 246
See application file for complete search history.

(56) References Cited

U.S. PATENT DOCUMENTS

| | | |
|---|---|---|
| 8,556,646 B2 | 10/2013 | Kappla et al. |
| 9,823,284 B2 | 11/2017 | Sterns et al. |
| 2004/0119553 A1 | 6/2004 | Nishimura |
| 2007/0059982 A1 | 3/2007 | Fogg et al. |
| 2009/0260847 A1 | 10/2009 | Tobben et al. |
| 2010/0003861 A1* | 1/2010 | Hetzer ............... H01R 13/6658 439/676 |
| 2011/0260813 A1 | 10/2011 | Broyde et al. |
| 2011/0273245 A1 | 11/2011 | Pai et al. |
| 2011/0279197 A1 | 11/2011 | Kameya |
| 2012/0062333 A1* | 3/2012 | Ezzeddine ............... H01P 5/185 333/116 |
| 2012/0098627 A1* | 4/2012 | Kameya .................... H01P 1/20 333/204 |
| 2014/0034363 A1 | 2/2014 | Biddle |

FOREIGN PATENT DOCUMENTS

| | | |
|---|---|---|
| JP | 2007157393 A | 6/2007 |
| JP | 2010267484 A | 11/2010 |
| WO | 2011072869 A1 | 6/2011 |
| WO | 2011089003 A1 | 7/2011 |
| WO | 2013164453 A2 | 11/2013 |

OTHER PUBLICATIONS

DesignCon 2012 "Where Chipheads Connect", Santa Clara, California, USA Jan. 30-Feb. 2, 2012, vol. 1 of 4, ISBN:978-1-62276-645-1.

* cited by examiner

DEVICE AND METHOD FOR TRANSMITTING DIFFERENTIAL DATA SIGNALS

CROSS-REFERENCE TO RELATED APPLICATION

This is a continuation application, under 35 U.S.C. § 120, of copending international application No. PCT/EP2015/058095, filed Apr. 14, 2015, which designated the United States; this application also claims the priority, under 35 U.S.C. § 119, of German patent application No. DE 10 2014 207 367.7, filed Apr. 16, 2014; the prior applications are herewith incorporated by reference in their entirety.

BACKGROUND OF THE INVENTION

Field of the Invention

The invention relates to an apparatus and a method for signal transmission for differential data signals on a high speed data link and particularly for reducing a common mode signal component. The apparatus contains a printed circuit board having a conductor pair having a first signal conductor and a second signal conductor for transmitting the differential data signal.

In the realm of data transmission, for example in computer networks, data transmission involves the use of data cables that typically have multiple data lines combined in a common cable sheath. For high speed data transmissions, the data lines used in each case are shielded wire pairs, the two wires particularly running parallel to one another or alternatively being twisted together. In this case, a respective wire consists of the actual conductor, for example a solid conductor wire or a stranded conductor, each of which is surrounded by an insulation. The wire pair of a respective data line is surrounded by a (pair) shield. The data cables typically have a multiplicity of wire pairs shielded in this manner that are surrounded by a common cable sheath. Such data cables are used for high speed data links and are designed for data rates of greater than 5 Gbit/s.

Such data cables are connected to connectors in a preassembled manner. In the case of applications for high speed transmissions, the connectors are then frequently in the form of what are known as small form pluggable connectors, SFP connectors for short. There are different variant embodiments of these, for example what are known as SFP−, SFP+, QSFP− or CXP− connectors. These connectors have special connector housings, as can be seen from international patent disclosures WO 2011 072869 A1 (corresponding to U.S. Pat. No. 8,444,430) or WO 2011 089003 A1 (corresponding to U.S. Pat. No. 8,556,646), for example.

Inside, such connector housings have a printed circuit board or card in part with integrated electronics. On this card, the respective data cable can be connected using a connector reverse. This involves the individual wires of the data cable being soldered or welded to the card. At the opposite end of the card, the end typically forms a plug-in tongue with connection contacts that are inserted into a mating connector. Such cards are also referred to as paddle cards.

In this case, the pair shielding of a respective wire pair is—as can be seen from published, European patent application EP 2 112 669 A2, for example—in the form of a longitudinally folded foil shield. The shield is therefore folded around the wire pair so as to run in a longitudinal direction of the cable, the two ends overlapping in an overlap region that runs in the longitudinal direction. The shielding foil used for the shield is a multilayer shield containing at least one conductive (metal) layer and an insulating layer. The conductive layer used is usually an aluminum layer, and the insulating layer used is a PET film. The PET film is in the form of a support on which a metal coating has been applied to form the conductive layer.

Besides the longitudinally folded shielding for pairs with parallel routing, there is fundamentally also the possibility of wrapping such a shielding foil helically around the wire pair. However, at higher signal frequencies upward of approximately 15 GHz, such braiding of the wire pair with a shielding foil is not readily possible on account of resonance effects. At these high frequencies, the shielding foil is therefore added as a longitudinally folded foil.

Such a longitudinally folded foil is accompanied by an undesirable negative side effect, however. What is known as the common mode signal is no longer attenuated to a sufficient degree with the longitudinally folded shields, as is the case with braiding with a shielding foil.

Such data cables are typically what are known as balanced data lines, which are designed for differential data transmission. This involves the two wires being used to transmit the same signal in inverted form. The differential signal component between these two signals is evaluated, so that external effects, which affect both signals, are eliminated.

The formation of the common mode signal in the case of such balanced lines with parallel pairs is known in principle. Attenuation of this undesirable common mode signal is additionally hampered by the fact that this common mode signal component propagates more quickly than the differential signal component that is actually of interest. The absent or severely reduced attenuation of this common mode signal in comparison with braided wire pairs therefore leads to impairment of what is known as the skew or what is known as the mode conversion performance.

With such high speed data links, an increase in transmission power is generally sought. The transmission rates and hence the frequency range of such data cables therefore increase to an ever greater extent, and hence so do the problems relating to the common mode signal components.

In order to filter out common mode signal components, abandoned U.S. patent publication No. 2011/0273245 A1, for example, discloses the practice of introducing a meandrous structure in a ground plane of a multilayer printed circuit board.

The article "Miniaturization of Common Mode Filter based on EBG Patch Resonance", Francesco De Paulis et al, DesignCon 2012 "Where Chipheads Connect", Santa Clara, Calif., USA, Jan. 30-Feb. 2, 2012, Proceedings, pages 2320-2338, describes a common mode filter in which a multilayer printed circuit board has, arranged beneath a conductor track, a matrix-shaped conductive structure, what is known as the EBG plane, between the conductor track and a ground plane.

Finally, U.S. Pat. No. 6,995,629 discloses the practice of avoiding spurious signals caused by a common mode signal by electrically connecting the two signal conductors to ground via a resistor and a capacitance.

SUMMARY OF THE INVENTION

Against this background, the invention is based on the object of allowing such a high speed data link to have improved data transmission at high signal frequencies of greater than 10 GHz and of achieving a high level of attenuation for a common mode signal.

The object is achieved in accordance with the invention by means of an apparatus having the features of the main apparatus claim and by means of a method having the features of main method claim. Preferred developments are contained in the subclaims. The preferred embodiments cited for the apparatus can also be transferred mutatis mutandis to the method.

The apparatus is configured particularly for transmitting data signals in a high speed data link at a transmission rate of typically greater than 10 Gbit per second. It has a printed circuit board having a conductor pair added thereto having a first signal conductor and a second signal conductor, which are used to transmit a differential data signal during operation. Additionally, the conductor pair has an associated decoupling line that runs symmetrically and without interruption in relation to the signal conductors and into which common mode signal components are decoupled during operation. Additionally, the decoupling line is connected to a ground conductor, which is to say to ground potential, via at least one attenuating element.

This embodiment selectively decouples only the common mode signal components from the signal conductors into the decoupling line, where they are attenuated by the attenuating element. The attenuating element therefore consumes the energy in the common mode signal component, and the undesirable common mode signal components are absorbed at least in part.

This embodiment is based on the consideration that selective decoupling of the common mode signal components is possible for a differential signal transmission. Decoupling the spurious common mode signal components therefore allows them to be effectively reduced, in particular attenuated. The spurious signal component is therefore at least reduced by decoupling from the transmission path.

The functional principle of the decoupling line is based on the differential components in total decoupling no power into the decoupling line, since—owing to the symmetrical arrangement of the decoupling line—their signal components are subtracted from one another in each case. Conversely, especially in the case of the common mode signals, the components on the two signal conductors are added, which means that they are thus coupled into the decoupling line by means of coupling mechanisms.

The functional principle of the apparatus is therefore configured in the manner of a directional coupler, in which particular signal components, in this case the common mode signal components, within a particular frequency band are thus decoupled from the transmission path.

In this case, the decoupling line extends over a coupling path without interruption and symmetrically in relation to the signal conductors. In this context, without interruption is understood to mean that the decoupling line forms a continuous conductive path, particularly a continuous conductor track. In this case, the two signal conductors have particularly precisely one associated decoupling line that runs symmetrically in relation to the signal conductors. The signal conductors themselves run parallel to one another at least over large sections.

In this context, symmetrical arrangement of the decoupling line is understood to mean that the decoupling line, at least over a large portion of its length, is at the identical same distance—in a transverse plane perpendicular to the direction of propagation of the signal conductors—from each of the signal conductors. In other words: The signal conductors are situated within a common conductor plane. They have a (mirror) symmetrical arrangement in respect of a center plane that is oriented perpendicular to the conductor plane.

In addition, the decoupling line is in (mirror) symmetrical form in respect of this center plane. This symmetrical arrangement fundamentally ensures that only the common mode signal components, and not also differential signal components, for example, are decoupled. In this case, this symmetrical arrangement preferably extends over the entire decoupling line, so that the decoupling line is at the same distance from the two signal conductors at each longitudinal position. To a certain extent, the decoupling line therefore forms an axis of symmetry for the entire decoupling structure.

To maintain the symmetry in the region of the attenuating element too, an expedient embodiment—at least as seen in a projection or in plan view—has the attenuating element arranged symmetrically between the signal conductors. On account of the installation space required for the electronic assembly for the attenuating element and the usually comparatively narrow parallel course of the signal conductors, a preferred development additionally has provision for a distance of the signal conductors from one another to be increased in the region of the attenuating element. To this end, the two signal conductors flare in an approximately funnel-like manner in a transition region and subsequently run parallel to one another at an increased distance in the region of the attenuating element. This interspace at the increased distance then contains the attenuating element in a symmetrical arrangement between the signal conductors.

Differential signal lines of this kind frequently have an electronic component, particularly what is known as an isolating capacitor (DC isolating capacitor), connected to the respective signal conductor. In this case too, again in view of the desired symmetry, a preferred embodiment has provision for the distance of the signal conductors from one another to be increased in the region of such components. At the same time or alternatively, the decoupling line has a taper in the style of a constriction in the region of such components. In particular, an increase in the distance between the signal conductors is combined with a taper in the decoupling line. Overall, this measure allows a compact, space-saving arrangement of such components on the printed circuit board while maintaining the desired symmetry.

Expediently, the printed circuit board contains multiple layers, at least one of which is in the form of a ground layer having the ground conductor. The attenuating element is expediently connected to this ground layer, which is to say to the ground conductor, via what is known as a plated-through hole through multiple layers to the ground conductor. In this case, a respective layer of the printed circuit board is formed by an insulating support layer made of substrate material having electrical layers or electrical conductor tracks added thereto. The substrate material is a standard substrate material for printed circuit boards. The plated-through holes therefore form electrically conductive connections between the attenuating element and the ground conductor. Such plated-through holes are likewise known in principle in printed circuit board technology. In this regard, by way of example, perpendicular holes penetrating the substrate material are made whose inner wall is conductive, so that a conductive connection is formed through the substrate material.

In an expedient form, ground regions are formed at the edge in a respective layer, so that the signal conductors and/or the decoupling line are thus arranged between ground potentials within the respective plane. In this case, the edge ground regions are again formed by preferably extensive conductor track regions. These are connected to the ground plane by preferably a multiplicity of plated-through holes extending along the conductor tracks.

In a preferred development, the attenuating element is connected to the decoupling line at an outer region thereof. In this case, the electrically conductive connection to the ground conductor is made at an inward distance, that is to say at a distance from the outermost region of the decoupling line. For the connection to the ground conductor, an aperture is formed in the decoupling line, the plated-through hole being arranged in this aperture. This measure allows the length of the decoupling line to be maximized for a given total length of the printed circuit board. At the same time, the aperture in the decoupling line continues to maintain the desired symmetry. The aperture is therefore a symmetrical recess in the decoupling line that is at the same distance from the two signal conductors. The recess is circular, in particular, in this case.

In an expedient embodiment, an attenuating element is expediently arranged at each end of the decoupling line and connected to the ground conductor. This achieves effective attenuation of the common mode signal component.

The attenuating element is additionally preferably a nonreactive resistance. For a typical application, the resistance value in this case is in the region of a few ohms, for example in the range from 5 to 50 ohms and particularly approximately in the region of 20 ohms per attenuating element.

In principle, there is the possibility of arranging the decoupling line and the signal conductors next to one another within one layer. However, studies have shown that this achieves only limited attenuation of the common mode signal components.

In an expedient development, there is therefore provision for the decoupling line and the signal conductors to be arranged in different layers. Preferably, the signal conductors are arranged within one layer in this case. The decoupling line is formed, in a manner isolated by a substrate material of the printed circuit board, in a layer particularly beneath the two signal conductors. In this case, the plane of the decoupling line is arranged preferably at a distance of from 80 μm to 200 μm and particularly at a distance of approximately 100 μm from the plane of the signal conductors. That is to say that the thickness of the substrate between the signal conductors and the decoupling line corresponds to this distance.

At the same time, a substrate thickness of a further printed circuit board layer between decoupling line and ground conductor is preferably different therefrom, particularly greater, and is particularly in a range between 200 μm and 400 μm and particularly in the region of approximately 300 μm. The individual substrate or support layers of the multilayer printed circuit board are chosen in accordance with the respective electrical and/or mechanical demands. The choice of a comparatively thin substrate layer between the signal conductors and the decoupling line achieves efficient decoupling of the undesirable common mode signal components. The substrate materials between the signal conductors and the decoupling line additionally preferably have a dielectric constant of approximately 3.4. Overall, this design achieves good decoupling.

Expediently, the decoupling line extends over the two signal conductors in a transverse direction, so that the decoupling line is distinctly wider in comparison with the signal conductors. Generally, the signal conductors and also the decoupling line are in the form of flat conductor tracks of the card. Such conductor tracks are produced in a manner that is known per se. Preferably, the decoupling line—as seen in a projection—terminates laterally at the outer edge of the two signal conductors, i.e. the width of the decoupling line corresponds to a distance between the outer edges of the signal conductors.

Preferably, the signal conductors do not extend linearly and therefore run, at least in sub regions, obliquely in relation to a printed circuit board longitudinal direction too. This measure achieves particularly adjustment and particularly increase of the conductor length on the printed circuit board. The adjustment of the length likewise also achieves the adjustment of a length of the coupling line and hence of the coupling path. The length of the coupling path affects the frequency band of the common mode signal component, which is decoupled and attenuated.

In an expedient embodiment, there is therefore also provision for the length of the coupling line to be chosen on the basis of a prescribed frequency band within which the undesirable common mode signals are decoupled. Preferably, the length is then chosen particularly such that there is an at least local attenuation maximum for the common mode signal in the range between 1 and 5 GHz and particularly at approximately 3 GHz. For the purpose for high speed data transmissions that is under consideration in the present case, the length of the coupling line is in a range between 10 and 18 and particularly in a range between 12 and 15 mm, for example, for data rates >5 Gbit/sec. Overall, the length of the coupling line is thus geared to the frequency band for which the decoupling in the manner of a filter is intended to take place (frequency band within which there is an absorption maximum). The greater the frequency, the shorter the coupling length is chosen (vice versa proportionally).

The printed circuit board usually has a rear connection region for a data cable having at least one signal pair, preferably having multiple signal pairs. In the front region, the printed circuit board is preferably in the form of a plug-in tongue of the connector and has contact strips. The decoupling structure and the decoupling line extend—except for these edge connection or contact regions—preferably over the entire available length of the printed circuit board, that is to say over a central region between the edge connection and contact regions. In this case, these connection and contact regions are formed particularly by contact pads, usually widened end conductor track regions. In addition, special coatings may be provided.

To make contact with the attenuating element on the decoupling line, the latter has a pad. Usually, the attenuating element is arranged on a top of the printed circuit board, on which the signal conductors are preferably also formed. To make contact with the two connections of the attenuating element firstly by the decoupling line and secondly by the ground conductor, two plated-through holes are therefore formed, one for the decoupling line and one for the ground line.

The printed circuit board preferably has a multilayer design and exhibits particularly the following layer structure: first substrate layer with ground layer—second substrate layer with decoupling line—third substrate layer with signal conductor and preferably with attenuating elements. Additionally, in an expedient embodiment, the signal conductor additionally has an insulating layer, particularly a solder resist, applied to it. In this case, this insulating layer expediently forms a topmost layer. Additionally, there is also the possibility of a double-sided design, in which there is thus an adjoining multilayer structure on both sides of a center plane, for example a central support layer or a central ground layer.

Preferably, the printed circuit board is arranged in a connector housing of a connector. In particular, the printed circuit board is additionally in the form of a plug-in card, one end of which forms a free plug-in contact tongue with contact areas or strips. This plug-in contact tongue is used to insert the printed circuit board into a corresponding receptacle of a mating connector, so that this plug-in contact tongue is used to transmit the data signals during operation. The connector is particularly a connector of small form pluggable (SFP) type, which can in principle be provided in different variant embodiments (SFP, SFP+, CXP, QSFP).

Opposite the end that forms the free plug-in contact tongue, the printed circuit board has the connection region to which the data cable is connected. Overall, the apparatus is therefore a pre-assembled data cable having a special connector. The data cable has multiple, usually twisted, wire pairs, a respective wire pair being used to transmit the differential data signal during operation. In this case, each wire pair is preferably surrounded by a (foil) shielding. A respective conductor of a wire pair is in electrical contact with a respective signal conductor of the printed circuit board, for example by soldering, welding, etc. At the same time, the shielding is in contact with a ground contact of the conductor track.

Other features which are considered as characteristic for the invention are set forth in the appended claims.

Although the invention is illustrated and described herein as embodied in a device and a method for transmitting differential data signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Parts having the same action are provided with the same reference symbols in the figures.

Figure 1:
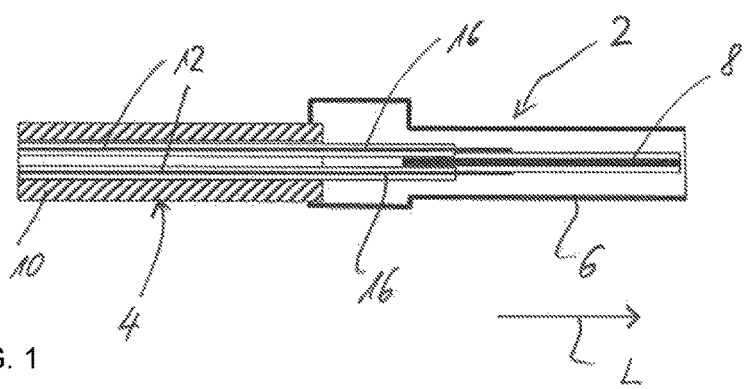
FIG. 1 is a highly simplified sectional view through a connector with a printed circuit board arranged therein and a connected data cable according to the invention.

Referring now to the figures of the drawings in detail and first, particularly to FIG. 1 thereof, there is shown a schematized cross-sectional representation of a detail from a pre-assembled cable with a (QSFP) connector 2 to which a data cable 4 is connected. The connector 2 has a connector housing 6 in which a printed circuit board 8 is arranged. The data cable 4 contains a sheath 10 that surrounds multiple wire pairs 12 provided with a pair shielding 16. A respective wire pair 12 has two respective conductors that, in a rear connection region of the printed circuit board 8, are in electrical contact with a conductor track that has been added to the printed circuit board 8. The respective conductor track is subsequently referred to as a signal conductor 14 (in this regard see FIG. 2). A pair shielding 16 is additionally in contact with a ground contact of the printed circuit board 8 in the connection region.

At the end opposite the connection region, the printed circuit board 8 is in the form of a plug-in tongue. This free end is inserted in a mating connector, not shown in more detail in the present case, having mating contacts. In this case, the printed circuit board 8 extends in a longitudinal direction L from the connection region to the plug-in tongue.

Figure 2:
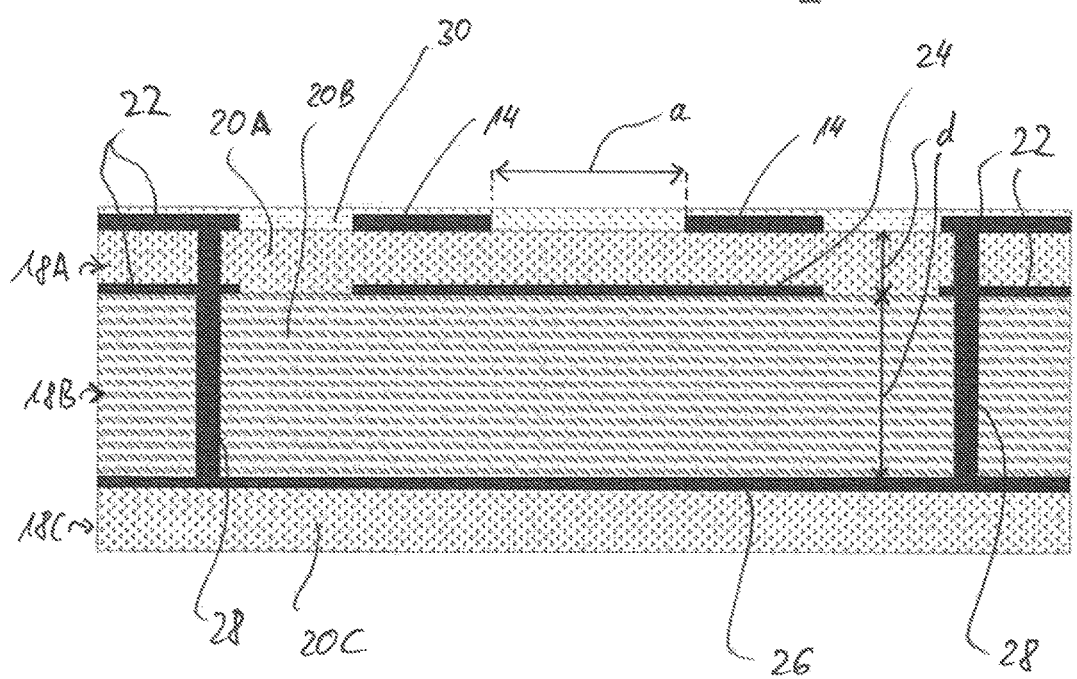
FIG. 2 is a sectional view of a detail of the printed circuit board.

The special design of the printed circuit board 8 is apparent particularly from FIG. 2. This shows a detail of just an upper half of the, overall, multilayer printed circuit board 8. In the exemplary embodiment of FIG. 1, the structure shown in FIG. 2 is adjoined in mirror image fashion downward by the identical structure once again, so that an identical layer structure is formed on both sides of a center plane. This allows electrical contact to be made with wire pairs 12 both on a top and on a bottom of the printed circuit board 8. Usually, contact is made with eight wire pairs, four on the top and four on the bottom. In this case, a respective wire pair 12 defines a signal path for transmitting a differential data signal. Four wire pairs then form a transmitter path and four wire pairs form a receiver path. The receiver path is used to couple data signals coming from the data cable 4 into the conductor track structure of the printed circuit board 8.

As can be seen from FIG. 2, the printed circuit board 8 has a design with three layers 18A, B, C. In this case, a respective layer 18A, B, C is formed by a support or a substrate layer 20A, B, C on which respective conductor track regions are formed. A topmost layer 18A has the signal conductors 14 formed on it, and ground regions 22 at the edge. The first layer 18A can therefore also be referred to as a signal conductor layer. The middle substrate layer 20B has a conductor track placed on it in the center, which forms a decoupling line 24. To the side of this, the ground regions 22 are again formed. The middle layer 18B can therefore also be referred to as a decoupling layer. The bottommost substrate layer 20C has had a preferably all-over conductive coating added to it that forms a ground layer and hence a ground conductor 26. During operation, the ground conductor 26 is connected to ground potential. The bottommost layer 18C can therefore also be referred to as a ground layer.

As can be seen very clearly from FIG. 2, the individual substrate layers 20A, B, C have different layer thicknesses d, the layer thickness d of the substrate layer 20A, which is arranged between the signal conductors 14 and the decoupling line 24, being smaller than the thickness d of the subsequent middle substrate layer 20B. The decoupling line 24 is therefore insulated from the signal conductors 14 by the substrate layer 20A, and there is no electrically conductive connection made. Preferably, the first substrate layer 20A has a thickness d in the region of approximately 100 μm and the second substrate layer 20B has a thickness d in the region of, by way of example, 300 μm.

The ground regions 22 of the different layers 18A, 18B are in electrical contact with the ground conductor 26 through a multiplicity of plated-through holes 28. As is evident particularly from the plan views of FIGS. 3A, 3B and 3C, a multiplicity of such plated-through holes 28 are formed along all of the ground regions 22 in the longitudinal direction of the printed circuit board. The individual plated-through holes 28 are at a distance of just a few mm or less from one another.

As revealed by FIG. 2, the two signal conductors 14 are arranged at a distance a from one another. They each have a conductor track width of typically 100 to 200 μm and preferably of approximately 175 μm. The distance a between the two signal conductors is a little greater and is typically 250 μm.

The decoupling conductor 24 arranged beneath the signal conductors 4 extends in the transverse direction Q over the two signal conductors 14, the edges of the decoupling conductor 24 preferably being flush with the outermost edges of the two signal conductors 14. The decoupling conductor 24 therefore has an overall width that corresponds to the width of the two signal conductors plus the distance a between them. Preferably, the width of the decoupling conductor 24 is in the range between 500 and 750 μm, particularly being 600 μm.

The topmost layer 18A is also covered by an insulating layer 30 that is preferably formed by a solder resist.

Figure 3A:
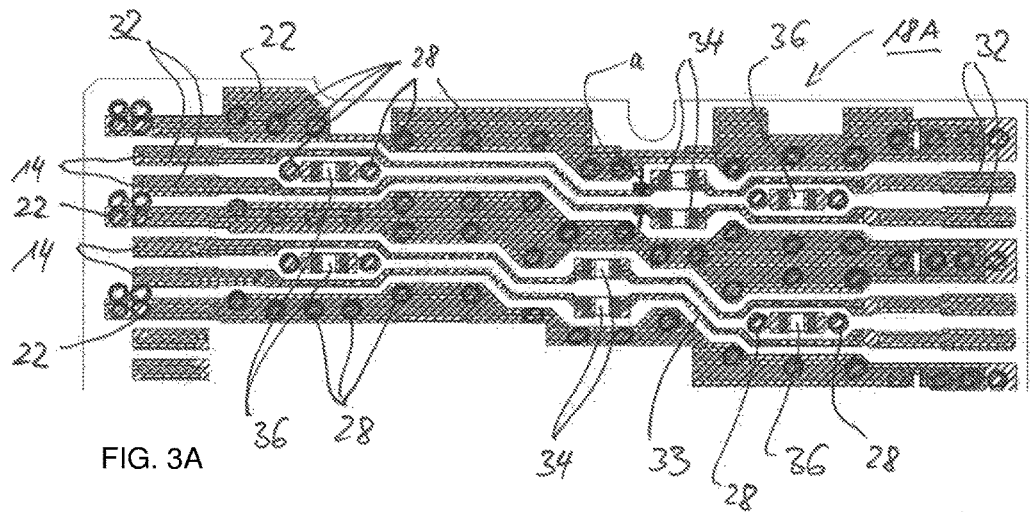
FIG. 3A is a plan view of a first layer of the printed circuit board.
Figure 3B:
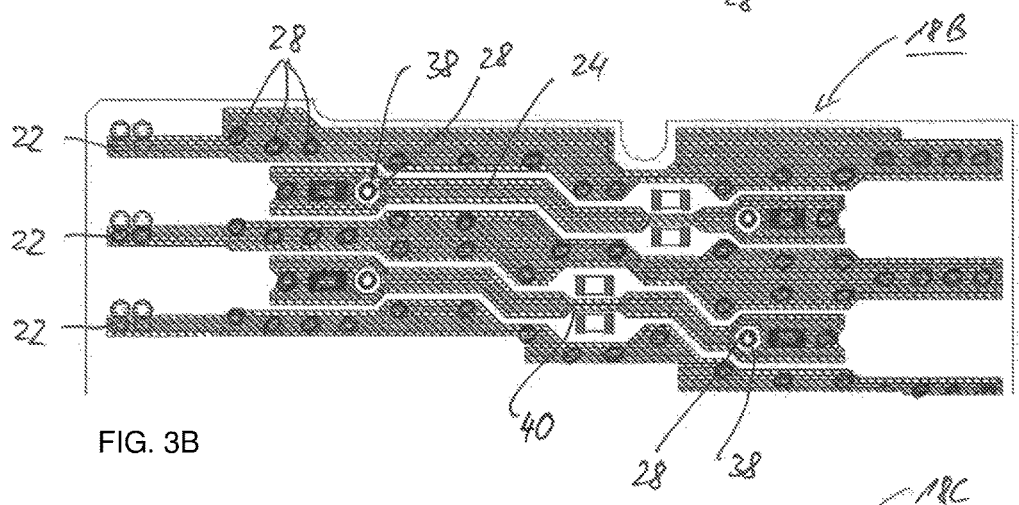
FIG. 3B is a plan view of a second layer of the printed circuit board.
Figure 3C:
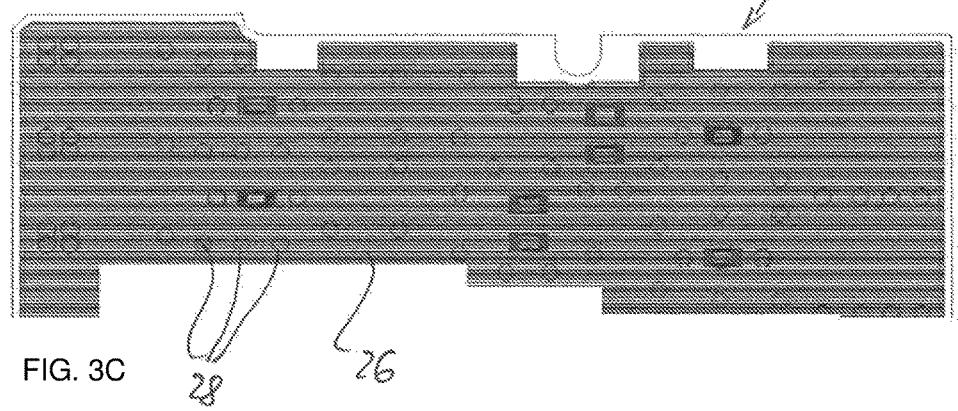
FIG. 3C is a plan view of a third layer of the printed circuit board, the individual FIGS. 3A, 3B, 3C showing identical details.

The representations of FIGS. 3A, 3B and 3C each show the same detail. By placing the respective representations on top of one another, the relative orientation of the individual conductor track regions of the individual layers 18A, B, C in relation to one another is therefore obtained.

In this case, the detail representations of FIGS. 3A, 3B and 3C show just a subregion of the printed circuit board 8, specifically just the subregion of the receiver paths that are provided with the decoupling line 24. This is usually also followed by a printed circuit board region with the transmitter paths.

FIG. 3A shows a detail from a plan view of the first layer 18A. FIG. 2 showed only a sectional representation in the region of a conductor pair with two signal conductors 14. FIG. 3A now shows a plan view of two such conductor pairs with a total of four signal conductors 14. In this case, a respective conductor pair is designed to transmit a differential signal. As is clearly revealed, respective adjacent signal conductors 14 forming a conductor pair are isolated by a ground region 22, so that a respective conductor pair is enclosed on both sides by ground regions 22.

A respective conductor track of the signal conductor 14 extends from an end pad 32 to an opposite pad 32. By way of example, the pads 32 are each formed by widened conductor track regions that may be additionally coated. In this case, the individual signal conductors 14 do not run exactly linearly but rather also have oblique conductor sections 33, as a result of which the total length of the signal conductors 14 is increased in comparison with a linear profile for a prescribed length of the printed circuit board 8. The total length of the printed circuit board is typically in the region of approximately 20 mm.

The topmost layer 18A has had different electronic components added that are connected firstly to the signal conductors 14 or to the decoupling line 24 and to the ground conductor 26.

Thus, as first components, DC isolating capacitors 34 are integrated in a respective signal conductor 14. To this end, relevant contact feet of the isolating capacitors 34 are connected to relevant pads of the signal conductors 14. On account of the physical size of these components, there is provision in this case for the distance a between the two signal conductors 14 to be increased in the region of these isolating capacitors 34. In this region, the distance a widens by virtue of a y-shaped or funnel-shaped flare in the signal conductors 14. Directly after the isolating capacitors 34, there is a correspondingly symmetrical taper to the original distance a.

Additionally, the topmost layer 18A has attenuating elements 36 arranged on it in the form of nonreactive resistances. In this case, each decoupling line 24 has a respective associated attenuating element 36 of this kind at the opposite ends of the decoupling line. The ends of each of the attenuating elements 36 are thus in electrical contact with the decoupling line 24 at opposite ends thereof.

These assemblies 36 also have the distance a between the signal conductors 14 widened. As a result, the attenuating element 36 is accommodated symmetrically between the signal conductors 14 of a respective conductor pair.

The attenuating element 36 has two respective connection regions that are at a distance from one another in the longitudinal direction. In order now to allow the largest possible coupling path and hence the greatest possible length for the decoupling line 24 up until connection of the attenuating elements 36, the respective external connection region of the attenuating element 36 is in electrical contact with the decoupling line 24. To this end, an aperture or a plated-through hole 28 is formed in the topmost substrate layer 20A in order to make contact between the attenuating element 36 and the underlying decoupling line 24.

By contrast, the connection region directed inward toward the center of the printed circuit board is in contact with the ground conductor 26 of the bottommost layer 18C via a plated-through hole 28.

As can be seen particularly from FIG. 3B, the decoupling line 24 has, to this end, an aperture 38 formed in it through which the plated-through hole 28 is routed. In the region of the attenuating elements 36, the decoupling line has a widened conductor track width, so that there is sufficient space firstly for making electrical contact and secondly also for making the aperture 38.

As is additionally revealed by the plan view of FIG. 3B, the respective decoupling line 24 has a taper 40, formed in the style of a constriction, in the region of the isolating capacitors 34. In the region of this taper 40, the conductor track width is reduced. FIGS. 3B and 3C show the electronic assemblies 34, 36 once again to improve clarity. Their physical arrangement is just on the topmost substrate layer 20A, however.

As can be seen therefrom, the profile of the decoupling line 24 follows the profile of the signal conductors 14 exactly. The decoupling line 24 therefore runs parallel to the signal conductors and follows the profile thereof. Just in the transition regions, where the distance a between the two signal conductors 8 varies on account of the arrangement of the components, particularly in the case of the isolating capacitors 34, there is a departure from the rigidly parallel profile. However, the decoupling line 24 is in rigidly symmetrical form, specifically, at each longitudinal position, in relation to the two signal conductors 14. As seen in a cross sectional plane, the decoupling line 24 is therefore at the same distance from each of the two signal conductors 14. As is additionally revealed by FIG. 3B, the ground regions 22 also follow the profile of the signal conductors 14, so that overall a highly symmetrical embodiment of the conductor track layout is achieved.

Finally, FIG. 3C clearly reveals that the ground conductor 26 is in the form of an extensive ground plane that covers at least a large part of the printed circuit board area.

During operation with data cable 4 connected and with high speed data transmission, each conductor pair is used to transmit a differential data signal SD. For example on account of the pair shielding 16 described at the outset, which is in the form of a longitudinally folded foil, what are known as common mode signals SC are also included, which are undesirable for the actual signal transmission. These signal components are likewise coupled into the signal conductors 14 as well. The special structure and the special design described in the present case selectively decouple, in the manner of a directional coupler, at least a subregion of the common mode signal components SC into the decoupling line 24. The energy of these decoupled signal components is consumed in the attenuating elements 36. Therefore, the decoupling structure with the decoupling line 24 and the attenuating elements 36 effectively forms a sump for the undesirable signal components and thereby results in improved signal transmission overall.

Figure 4:
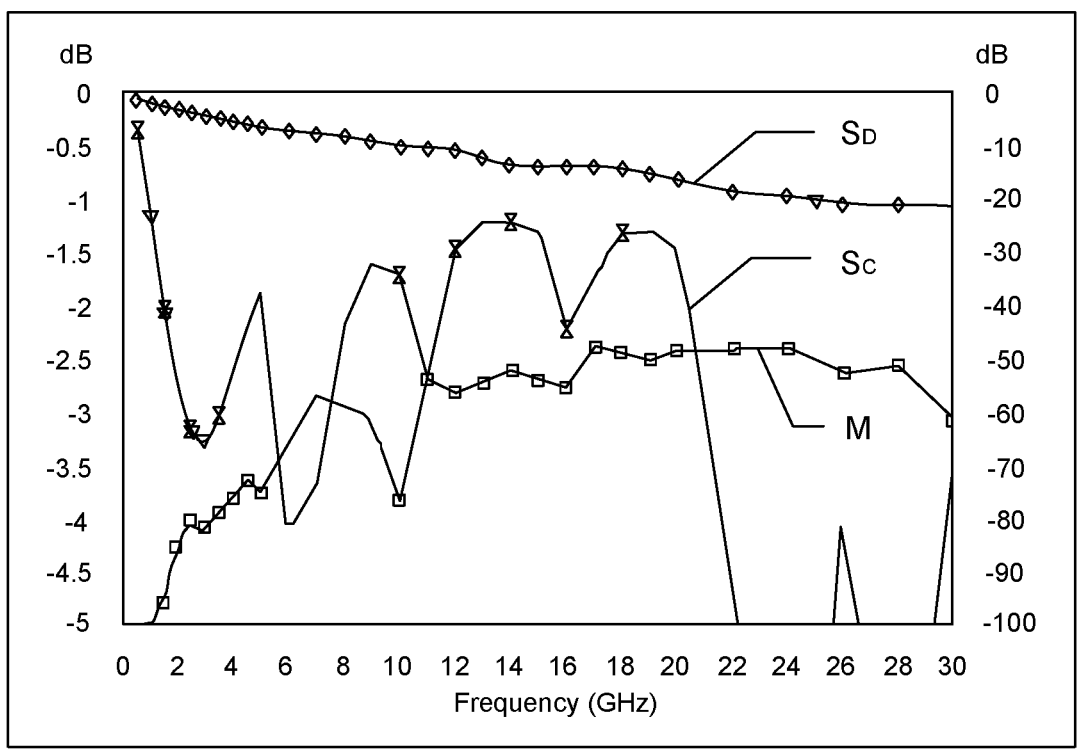
FIG. 4 is a graph showing a common mode signal and of a differential signal and also, additionally, a profile of a mode conversion, in each case over signal frequency.

The graph shown in FIG. 4 shows an example of a modeled profile of different variables. The results are based on the following described test setup.

The thickness d of the topmost substrate layer 20A is 100 μm, and the thickness d of the middle substrate layer 20B is 300 μm. The topmost substrate layer 20A has a dielectric constant $\varepsilon_r$ of approximately 3.4. The attenuating elements used were nonreactive resistances having a resistance value of 22 ohms. The isolating capacitors 34 have a rated capacitance of 100 nF.

What has been ascertained according to FIG. 4 is the profile of the attenuation of the differential signal components SD over frequency, the profile of the common mode signal components SC over frequency and what is known as the mode conversion M over frequency, respectively. Additionally, a common mode characteristic impedance of 50 ohms has been assumed. Generally, mode conversion is understood to mean the conversion of differential signal components SD into common mode signal components SC, and vice versa. Such mode conversion is fundamentally undesirable.

In this case, the left-hand y axis shows the attenuation values in dB for the differential signal component SD and the common mode signal component SC. By contrast, the right-hand y axis shows the attenuation values dB for the mode conversion.

As is clearly revealed, there is only slight attenuation of the differential signal component SD that is actually of interest over the entire frequency spectrum from 0 to 30 GHz. The attenuation increases as frequency increases, and reaches approximately −1 dB at approximately 25 GHz.

By contrast, a very severe attenuation of the common mode signal component SC is identifiable, which exhibits multiple maxima. In the case of the design chosen in the present case with a length of particularly approximately 14 mm for the decoupling line 24, a local attenuation maximum of approximately 3.2 dB is reached at approximately 3 GHz. The common mode signal component SC has further local attenuation maxima at approximately 6 GHz and 10 GHz.

Overall, therefore, the printed circuit board design with the decoupling structure that is described in the present case achieves effective attenuation of the undesirable common mode signal component SC. A crucial aspect in this context is that the arriving common mode components are not reflected but rather are even absorbed by the decoupling structure. Further studies have also shown that this design is also distinguished by a very good matching ratio, that is to say only low reflection of the common mode signal components SC back into the connected data cable 4. A crucial aspect is that the signal components SC are absorbed. In the present case, this is achieved especially effectively particularly for frequency ranges between 1 and 5 GHz, particularly in a region of approximately 3 GHz. The printed circuit board 8 described in the present case is fitted particularly in what is known as a QSFP connector as what is known as a QSFP paddle card.

The following is a summary list of reference numerals and the corresponding structure used in the above description of the invention:

2 Connector
4 Data cable
6 Connector housing
8 Printed circuit board
10 Sheath
12 Wire pair
14 Signal conductor
16 Pair shielding
18A, B, C Layer
20A, B, C Substrate layer
22 Ground region
24 Decoupling line
26 Ground conductor
28 Plated-through hole
30 Insulating layer
32 Pad
33 Oblique conductor sections
34 Isolating capacitor
36 Attenuating element
38 Aperture
40 Taper
d Layer thickness
a Distance
SD Differential signal component
SC Common mode signal component
M Mode conversion
L Longitudinal direction
Q Transverse direction

The invention claimed is:

1. An apparatus for signal transmission for differential data signals, comprising:
    a printed circuit board having a conductor pair with two signal conductors for transmitting the differential data signals, and a decoupling line associated with said conductor pair, said decoupling line being insulated from said conductor pair and running symmetrically and without interruption in relation to said two signal conductors, said printed circuit board further having a ground conductor and at least one attenuating element, said decoupling line being connected to said ground conductor via said at least one attenuating element such that a common mode signal component is at least in part outputted to said decoupling line, and attenuated, during operation; and
    said two signal conductors being at a distance from one another that is increased in a region of said at least one attenuating element, so that said at least one attenuating element is disposed symmetrically between said two signal conductors.

2. The apparatus according to claim 1, wherein said decoupling line is disposed symmetrically in relation to said two signal conductors over an entire length of said decoupling line.

3. The apparatus according to claim 1, further comprising a connector housing of a connector, said printed circuit board is disposed in said connector housing, and said printed circuit board is a plug-in card and one end of said plug-in card forms a free plug-in contact tongue.

4. The apparatus according to claim 1, further comprising isolating capacitors, said two signal conductors each having one of said isolating capacitors, and in that a distance between said two signal conductors is increased in a region of said isolating capacitors and/or said decoupling line has a taper in the region of said isolating capacitors.

5. The apparatus according to claim 1, wherein said at least one attenuating element is in contact with ends of said decoupling line.

6. The apparatus according to claim 1, wherein said at least one attenuating element is connected to said decoupling line at an outer region of said decoupling line and in that, at an inward distance therefrom, said at least one attenuating element is connected to said ground conductor and, said decoupling line having an aperture formed therein for a connection to said ground conductor.

7. The apparatus according to claim 1, further comprising components, said two signal conductors each have one of said components, and in that a distance between said two signal conductors is increased in a region of said components and/or said decoupling line has a taper in the region of said components.

8. The apparatus according to claim 1, wherein said at least one attenuating element is a nonreactive resistance.

9. The apparatus according to claim 1, wherein said printed circuit board has multiple layers and in that said two signal conductors and said decoupling line are formed in different ones of said multiple layers.

10. The apparatus according to claim 1, wherein said decoupling line extends over both said two signal conductors as seen in a transverse direction.

11. The apparatus according to claim 1, wherein said two signal conductors have turns such that said two signal conductors do not extend uniformly across said printed circuit board.

12. The apparatus according to claim 1, wherein a length of said decoupling line is chosen on a basis of a prescribed frequency band within which undesirable common mode signal components are intended to be decoupled, the length being chosen such that there is an attenuation maximum in a range between 1 and 5 GHz.

13. The apparatus according to claim 1, wherein said decoupling line has a pad formed thereon by means of which contact is made with said at least one attenuating element.

14. The apparatus according to claim 1, wherein said printed circuit board is of a multilayer design with a given layer structure having a first substrate layer with said ground conductor, a second substrate layer with said decoupling line, and a third substrate layer with said two signal conductors.

15. An apparatus for signal transmission for differential data signals, comprising:
a printed circuit board having a conductor pair with two signal conductors for transmitting the differential data signals, and a decoupling line associated with said conductor pair, said decoupling line being insulated from said conductor pair and running symmetrically and without interruption in relation to said two signal conductors, said printed circuit board further having a ground conductor and at least one attenuating element, said decoupling line being connected to said ground conductor via said at least one attenuating element such that a common mode signal component is at least in part outputted to said decoupling line, and attenuated, during operation; and said printed circuit board further having a plated-through hole formed therein and multiple layers, at least one of said multiple layers is in a form of a ground layer having said ground conductor, and in that said at least one attenuating element is connected to said ground conductor via said plated-through hole.

16. An apparatus for signal transmission for differential data signals, comprising:
a printed circuit board having a conductor pair with two signal conductors for transmitting the differential data signals, and a decoupling line associated with said conductor pair, said decoupling line being insulated from said conductor pair and running symmetrically and without interruption in relation to said two signal conductors, said printed circuit board further having a ground conductor and at least one attenuating element, said decoupling line being connected to said ground conductor via said at least one attenuating element such that a common mode signal component is at least in part outputted to said decoupling line, and attenuated, during operation; and said at least one attenuating element is in contact with an end of said decoupling line.

17. An apparatus for signal transmission for differential data signals, comprising:
a printed circuit board having a conductor pair with two signal conductors for transmitting the differential data signals, and a decoupling line associated with said conductor pair, said decoupling line being insulated from said conductor pair and running symmetrically and without interruption in relation to said two signal conductors, said printed circuit board further having a ground conductor and at least one attenuating element, said decoupling line being connected to said ground conductor via said at least one attenuating element such that a common mode signal component is at least in part outputted to said decoupling line, and attenuated, during operation; and said printed circuit board is of a multilayer design with a given layer structure having a first substrate layer with said ground conductor, a second substrate layer with said decoupling line, and a third substrate layer with said two signal conductors, said at least one attenuating elements and an outer insulating layer.

* * * * *